(12) United States Patent
Yu et al.

(10) Patent No.: US 11,785,713 B2
(45) Date of Patent: Oct. 10, 2023

(54) FLEXIBLE CABLE JUMPER STRUCTURE, AND METHOD FOR PRODUCING SAME

(71) Applicant: AMOGREENTECH CO., LTD., Gimpo-si (KR)

(72) Inventors: Jeong-Sang Yu, Gyeonggi-do (KR); Young-Suk Oh, Gyeonggi-do (KR); Taek-Min Kim, Gyeonggi-do (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 255 days.

(21) Appl. No.: 17/425,713

(22) PCT Filed: Jan. 13, 2020

(86) PCT No.: PCT/KR2020/000553
§ 371 (c)(1),
(2) Date: Jul. 23, 2021

(87) PCT Pub. No.: WO2020/153642
PCT Pub. Date: Jul. 30, 2020

(65) Prior Publication Data
US 2022/0192004 A1    Jun. 16, 2022

(30) Foreign Application Priority Data
Jan. 24, 2019 (KR) .......................... 10-2019-0009043

(51) Int. Cl.
*H05K 1/02* (2006.01)
*H05K 3/06* (2006.01)
(Continued)

(52) U.S. Cl.
CPC ........... *H05K 1/028* (2013.01); *H05K 1/0201* (2013.01); *H05K 3/06* (2013.01); *H05K 3/4644* (2013.01);
(Continued)

(58) Field of Classification Search
CPC .... H05K 1/028; H05K 1/0201; H05K 3/4644; H05K 2201/015; H05K 2201/0154; H05K 2201/10189; H05K 3/222; H01B 7/292
See application file for complete search history.

(56) References Cited

U.S. PATENT DOCUMENTS 5,008,656 A * 4/1991 Cheriff ................. H05K 7/1061
345/206
6,581,276 B2   6/2003 Chung
(Continued)

FOREIGN PATENT DOCUMENTS

JP       2011-187388 A    9/2011
KR  20-2009-0001003 U    2/2009
(Continued)

OTHER PUBLICATIONS

International Search Report for International Application No. PCT/KR2020/000553, dated Apr. 23, 2020, 5 pages with English Translation.
(Continued)

*Primary Examiner* — Sherman Ng
(74) *Attorney, Agent, or Firm* — TraskBritt

(57) ABSTRACT

A flexible cable jumper structure and manufacturing method thereof. The flexible cable jumper device of the present disclosure includes a cover layer, a first metal layer stacked on the cover layer and having a circuit pattern formed thereon, a first dielectric layer stacked on the first metal layer, a first adhesive layer applied on the first dielectric layer, a second metal layer stacked on the first dielectric layer to which the first adhesive layer is applied and having a circuit pattern formed thereon, a heat-resistant layer stacked on the second metal layer, and a terminal layer formed in one region of the heat-resistant layer and electrically connected to the first metal layer and the second metal layer.

9 Claims, 4 Drawing Sheets

(51) Int. Cl.
  *H05K 3/46* (2006.01)
  *H05K 1/18* (2006.01)
(52) U.S. Cl.
  CPC ....... *H05K 1/181* (2013.01); *H05K 2201/015* (2013.01); *H05K 2201/0154* (2013.01); *H05K 2201/10189* (2013.01)

(56) References Cited

U.S. PATENT DOCUMENTS

| | | |
|---|---|---|
| 2010/0186995 A1 | 7/2010 | Yeh |
| 2011/0100673 A1* | 5/2011 | Takamatsu ........... H05K 9/0098 174/102 SP |

FOREIGN PATENT DOCUMENTS

| | | |
|---|---|---|
| KR | 10-2014-0068456 A | 6/2014 |
| KR | 10-2015-0077225 A | 7/2015 |
| KR | 10-1664241 B1 | 10/2016 |
| KR | 10-2018-0025278 A | 3/2018 |
| WO | 2011/043129 A1 | 4/2011 |

OTHER PUBLICATIONS

International Written Opinion for International Application No. PCT/KR2020/000553, dated Apr. 23, 2020, 10 pages with English Translation.

* cited by examiner

FLEXIBLE CABLE JUMPER STRUCTURE, AND METHOD FOR PRODUCING SAME

CROSS-REFERENCE TO RELATED APPLICATIONS

This application is a national phase entry under 35 U.S.C. § 371 of International Patent Application PCT/KR2020/000553, filed, designating the United States of America and published as International Patent Publication WO 2020/153642 A1 on Jul. 30, 2020, which claims the benefit under Article 8 of the Patent Cooperation Treaty to Korean Patent Application Serial No. 10-2019-0009043, filed Jan. 24, 2019.

TECHNICAL FIELD

The present disclosure relates to a flexible cable jumper structure and a method for manufacturing the same, and more particularly, to a flexible cable jumper structure having heat resistance, low dielectric constant and low loss characteristics and a method for manufacturing the same.

BACKGROUND

There is a need for developing components to replace coaxial cables. Conventional coaxial cables are thick, and there is a problem in that work process becomes cumbersome when assembling electronic products (e.g., mobile terminals).

The adoption of a flexible jumper is required to replace such a coaxial cable. As is known so far, there is a demand for heat resistance to withstand a high-temperature process during the manufacture of the flexible jumper. In order to meet this demand, an attempt has been made to use a polyimide (PI) resin as a cover layer.

Polyimide has excellent properties in terms of heat resistance that can withstand a process temperature of 240° C. to 260° C., but polyimide has a problem in that a signal interference phenomenon occurs because of its high dielectric constant.

Accordingly, there is a demand for the development of a new material having a low dielectric constant characteristic while maintaining heat resistance. In this situation, there are various material groups presented as low dielectric materials, and there is a need for developing a new type of flexible jumper structure that shows heat resistance and low dielectric constant characteristics by applying the characteristics of these material groups to the flexible jumper.

BRIEF SUMMARY

Technical Problem

The present disclosure is devised by the above-mentioned desires, and the object of the present disclosure is to provide a flexible cable jumper structure having heat resistance and low loss characteristics by using a material having heat resistant and a low-dielectric constant in a hybrid structure, and a method for manufacturing the same.

Technical Solution

In order to achieve the above objects, the flexible cable jumper structure according to an embodiment of the present disclosure includes a cover layer, a first metal layer stacked on the cover layer and having a circuit pattern formed thereon, a first dielectric layer stacked on the first metal layer, a first adhesive layer applied on the first dielectric layer, a second metal layer stacked on the first dielectric layer to which the first adhesive layer is applied and having a circuit pattern formed thereon, a heat resistant layer stacked on the second metal layer, and a terminal layer formed in one region of the heat resistant layer and electrically connected to the first metal layer and the second metal layer.

In addition, the flexible cable jumper structure may further include a second dielectric layer stacked on the second metal layer, a third metal layer stacked on the second dielectric layer and having a circuit pattern formed thereon, and a second adhesive layer applied on the third metal layer. The heat resistant layer may be formed on the third metal layer to which the second adhesive layer is applied.

According to another embodiment of the present disclosure, the cover layer and the heat resistant layer may be polyimide.

According to another embodiment of the present disclosure, the first dielectric layer and the second dielectric layer may be polytetrafluoroethylene.

According to another embodiment of the present disclosure, an upper surface or a lower surface of the second dielectric layer may be provided with an irregularity.

According to another embodiment of the present disclosure, the method for manufacturing a flexible cable jumper structure may include the steps of: preparing a cover layer; stacking a metal on the cover layer and etching the stacked metal to form a first metal layer forming a circuit pattern; stacking a first dielectric layer on the first metal layer; applying a first adhesive layer on the first dielectric layer; stacking a metal on the first dielectric layer to which the first adhesive layer is applied, and etching the stacked metal to form a second metal layer forming a circuit pattern; stacking a heat resistant layer on the second metal layer; and forming a terminal layer formed in one region of the heat resistant layer and electrically connected to the first metal layer and the second metal layer.

In addition, the method for manufacturing a flexible cable jumper structure may further include the steps of: after forming the second metal layer, stacking a second dielectric layer on the second metal layer; stacking a metal on the second dielectric layer and etching the metal to form a circuit pattern to form a third metal layer; and stacking a second adhesive layer on the third metal layer.

According to another embodiment of the present disclosure, the method for manufacturing a flexible cable jumper structure may further include the step of forming an irregularity on an upper surface or a lower surface of the second dielectric before the step of stacking the second dielectric layer.

According to another embodiment of the present disclosure, the method for manufacturing a flexible cable jumper structure may further include the steps of: etching a surface of the first dielectric layer after the step of stacking the first dielectric layer; and etching a surface of the second dielectric layer after the step of stacking the second dielectric layer.

According to another embodiment of the present disclosure, in the step of stacking the heat resistant layer, the heat resistant layer may be stacked by coating a polyimide film in a printing method.

According to another embodiment of the present disclosure, in the step of stacking the heat resistant layer, the heat resistant layer may be stacked on the second metal layer by heating and pressing a polyimide film in a hot press method under an interposition of an adhesive layer.

Advantageous Effects

According to various embodiments of the present disclosure, the flexible cable jumper structure exhibits excellent heat resistance and low loss by stacking a heat resistant material and a low dielectric material in a hybrid.

EXPLANATION OF REFERENCE NUMERALS AND SYMBOLS

Figure 1:
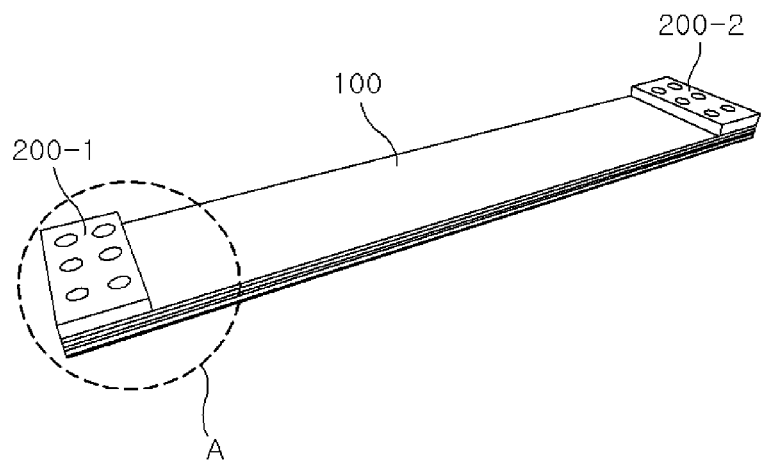
FIG. 1 is a view explaining the appearance of a flexible cable jumper device in which a connector is assembled to a flexible cable jumper structure according to an embodiment of the present disclosure.

100: flexible cable jumper structure
110-1, 110-2: cover layer, heat resistant layer
130-1, 130-2, 130-3: first metal layer, second metal layer, third metal layer
150-1, 150-2: first dielectric layer, second dielectric layer
170-1, 170-2: first adhesive layer, second adhesive layer
190: terminal layer
200: connector

DETAILED DESCRIPTION

Various embodiments of the present disclosure will be described with reference to the following drawings. The shape, material, size, and the like of each component shown in the drawings are illustratively shown for convenience of description, and they may be variously designed and changed according to the technical spirit of the present disclosure.

FIG. 1 is a view explaining the appearance of a flexible cable jumper device in which a connector is assembled to a flexible cable jumper structure according to an embodiment of the present disclosure. Referring to FIG. 1, a flexible cable jumper structure 100 according to an embodiment of the present disclosure may be used for electrical connection of other electronic devices by assembling and fastening connectors 200-1 and 200-2 at one end or both ends thereof.

The flexible cable jumper structure 100 of the present disclosure can exhibit heat resistance and low loss characteristics by stacking a heat resistant material and a low dielectric material in a hybrid manner. The stacked structure of the flexible cable jumper structure 100 of the present disclosure will be described in more detail below. The flexible cable jumper structure shown in FIG. 1 may include connectors 200-1 and 200-2 that are installed on a terminal layer 190 by a surface mount technology (SMT) method. The connectors 200-1 and 200-2 function as interfaces for electrical connection between a board and a board and between a board and a component in an electronic device.

The flexible cable jumper structure 100 shown in FIG. 1 has heat resistance and low loss characteristics, and thus may be used as a core material of the flexible cable jumper device. In order to exhibit such heat resistance and low loss characteristics, there is a characteristic in the stacking order and stacking method of a heat resistant material and a low loss material. The stacked structure of the flexible cable jumper structure 100 will be separately described below with reference to the enlarged view of the area A shown in FIG. 1.

Figure 2:
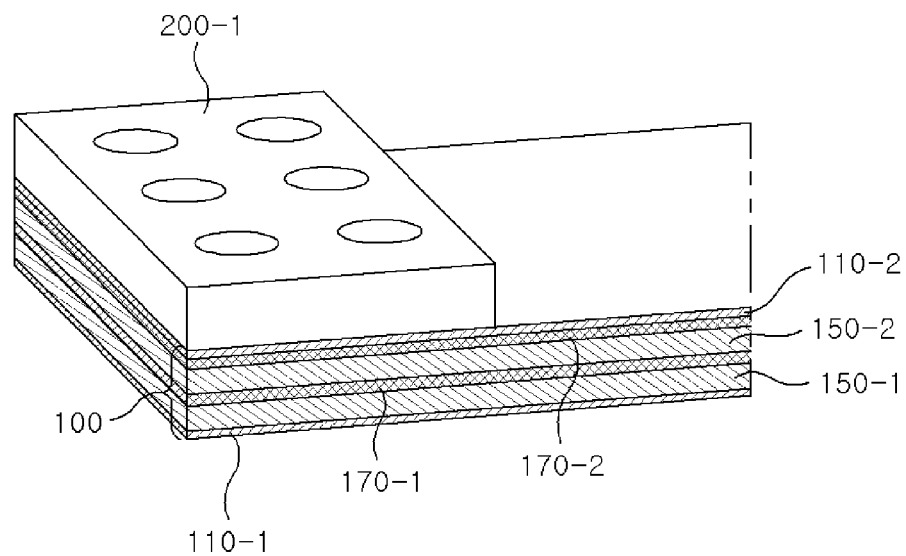
FIG. 2 is a view illustratively showing a cross section of area A shown in FIG. 1.

FIG. 2 is a view illustratively showing a cross section of area A shown in FIG. 1. Referring to FIG. 2, the flexible cable jumper structure 100 is composed of a multi-layer constituted of a metal layer, a dielectric layer, an adhesive layer, and the like sequentially from a lower cover layer, which becomes the base layer, and the flexible cable jumper structure 100 of the present disclosure has technical characteristics in the thickness of each layer constituting the multi-layer, a surface processing method, the material of each layer, and the stacking order of the layers.

The material, thickness, stacking order, surface processing method, and the like of each layer of the flexible cable jumper structure 100, which is a core component of the flexible cable jumper device of the present disclosure, will be described below with reference to separate drawings.

Figure 3:
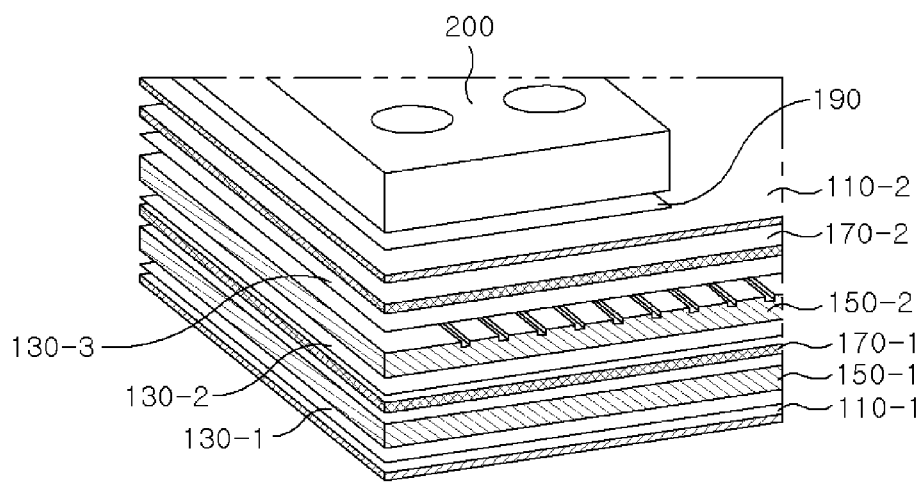
FIG. 3 is a view illustratively explaining the stacked structure of the flexible cable jumper structure in the area A shown in FIG. 1.

FIG. 3 is a view illustratively explaining the stacked structure of the flexible cable jumper structure in the area A shown in FIG. 1. Referring to FIG. 3, a cover layer 110-1 may be positioned on the lowermost layer of the flexible cable jumper structure 100. In FIG. 3, the cover layer 110-1 may be a base layer. The cover layer 110-1 may be formed of a heat resistant material, preferably polyimide. The thickness of the cover layer 110-1 may be 25 μm to 40 μm, and preferably, a thickness of 30 μm to 35 μm may be used. Since the cover layer 110-1 is a material having good heat resistance, basic properties can be maintained without physical or chemical change even at a process temperature of 240° C. to 260° C.

A first metal layer 130-1 having a predetermined circuit pattern may be positioned on the cover layer 110-1. The first metal layer 130-1 may be electrically connected to a connector 200, which will be described later. The first metal layer 130-1 may be made of a material having excellent electrical conductivity, such as copper, gold, platinum, silver, and the like.

Various methods may be used for the structure and method of electrical connection between the first metal layer 130-1 and the connector 200. For example, an electrical path between the first metal layer 130-1 and the terminal layer 190 may be formed by a via hole method, or an electrical connection may be formed by an interface terminal with the connector 200. Since this method has little relevance to understanding the technical idea of the present disclosure, a detailed description thereof will be omitted. However, it is apparent that a generally known electrical connection method between a connector and a multi-layer metal layer can be applied.

A first dielectric layer 150-1 may be stacked on the first metal layer 130-1 using a low dielectric material. The first dielectric layer 150-1 uses a low dielectric material, and may preferably use polytetrafluoroethylene and other materials having similar physical properties.

The following Chemical Formula 1 represents the chemical structure of polytetrafluoroethylene (PTFE).

[Chemical Formula 1]

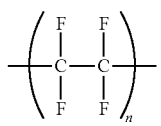

Polytetrafluoroethylene consists of large molecules prepared by chemically bonding many small molecules (units) in the form of chains or networks.

Polytetrafluoroethylene is a non-flammable fluororesin belonging to the class of organic polymers. Polytetrafluoroethylene shows excellent electrical properties such as extremely low dielectric loss, high insulation, breakdown voltage, and the like. In particular, polytetrafluoroethylene shows minimum values in both dielectric constant and dielectric loss factor, while maintaining stability over a wide range of temperatures and frequencies due to extremely high volume resistivity, so it can be used as an insulating material. Polytetrafluoroethylene has a dielectric constant of 2.1 at 1 MHz. The thickness of the first dielectric layer 150-1 may be 100 μm to 150 μm, and preferably 110 μm to 140 μm. Polytetrafluoroethylene may be used by forming roughness on the surface through a chemical etching process on the upper and/or lower surface thereof in order to increase adhesion.

A first adhesive layer 170-1 may be applied on the first dielectric layer 150-1. The first adhesive layer 170-1 may be applied to a thickness of 30 μm to 70 μm, and preferably may be applied to a thickness of 40 μm to 60 μm.

A second metal layer 130-2 may be stacked on the surface on which the first adhesive layer 170-1 is applied. The second metal layer 130-2 may be processed into a predetermined circuit pattern and provide electrical paths on both sides of the flexible cable jumper device. The second metal layer 130-2 may be made of a material having excellent electrical conductivity, such as copper, gold, platinum, silver, and the like.

A second dielectric layer 150-2 may be stacked on the second metal layer 130-2. As described above, the second dielectric layer 150-2 may be formed of a material having the same material and thickness as the first dielectric layer 150-1 and having a low dielectric constant. For example, polytetrafluoroethylene can be used.

A contact force between the second metal layer 130-2 and the third metal layer 130-3 can be increased without using a separate contact agent by providing an irregularity structure on the upper and/or lower surface of the second dielectric layer 150-2. For a more detailed description, reference is made to a separate drawing.

Figure 4:
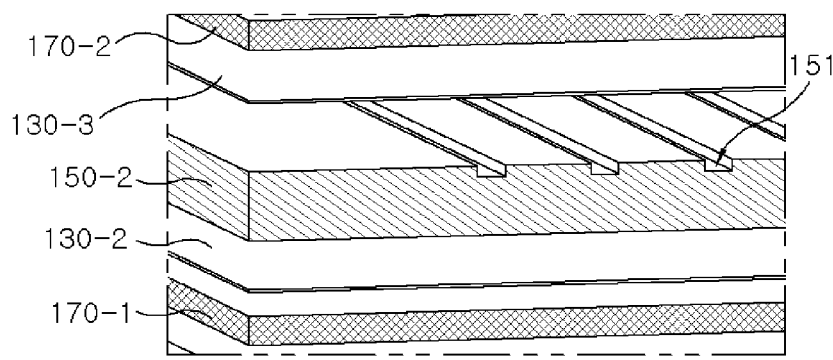
FIG. 4 is a view illustratively explaining an irregularity structure provided on an upper surface of a second dielectric layer between the second metal layer and the third metal layer shown in FIG. 1.

FIG. 4 is a view illustratively showing an irregularity structure provided on an upper surface of a second dielectric layer between the second metal layer and the third metal layer shown in FIG. 1. Referring to FIG. 4, a plurality of irregularities 151 may be formed on the upper surface of the second dielectric layer 150-2. The shape, size, and dimension of the irregularity may vary depending on the thickness, width, and length of the second dielectric layer 150-2. In addition to the upper surface of the second dielectric layer 150-2, irregularities may be provided on the lower surface, and some or all of the upper surface and/or the lower surface may have irregularities. By providing the irregularity structure on the upper and lower surfaces of the second dielectric layer 150-2, the contact force between the second metal layer 130-2 and the third metal layer 130-3 and the second dielectric layer 150-2 may be increased.

Also, referring to FIG. 3, the third metal layer 130-3 may be formed on the second dielectric layer 150-2. The third metal layer 130-3 may have a circuit pattern having a predetermined shape and provide electrical paths on both sides of the flexible cable jumper device.

A second adhesive layer 170-2 may be applied on the third metal layer 130-3. The thickness of the second adhesive layer 170-2 may be applied to a thickness of 30 μm to 70 μm, and preferably 40 μm to 60 μm. The third metal layer 130-3 may be made of a material having excellent electrical conductivity, such as copper, gold, platinum, silver, and the like.

A heat resistant layer 110-2, which is a heat resistant material, may be stacked on the second adhesive layer 170-2. Here, as the heat resistant layer 110-2, a material having excellent heat resistance characteristics may be used, and polyimide may be preferably used. The thickness of the heat resistant layer 110-2 may be 25 μm to 40 μm, preferably 30 μm to 35 μm. Since the cover layer 110-1 is a material having excellent heat resistance, basic properties can be maintained without physical and chemical changes even at a process temperature of 240° C. to 260° C. By finishing the upper surface with the heat resistant layer 110-2, it is possible to exert an effect of preventing thermal deformation even during the process of configuring the connector 200 by applying SMT.

That is, the present disclosure can significantly reduce the occurrence of daisies after the SMT process and prevent thermal deformation from occurring even after a reflow process by using polyimide, which is a heat resistant material, as the cover layer 110-1 and the heat resistant layer 110-2, which are heat resistant materials.

In addition, since the first dielectric layer 150-1, which is a low dielectric material, is provided between the first metal layer 130-1 and the second metal layer 130-2, and the second dielectric layer 150-2 is provided between the second metal layer 130-2 and the third metal layer 130-3, an effect of low loss can be achieved.

The terminal layer 190 may be formed to electrically connect the heat resistant layer 110-2 and the connector 200. The terminal layer 190 may be formed in one region of both sides or one side of the uppermost surface of the flexible jumper structure. The terminal layer 190 may be made of a material having excellent electrical conductivity, such as copper, gold, platinum, silver, and the like.

Here, in the step of stacking the heat resistant layer, the heat resistant layer may be stacked on the second metal layer by heating and pressing the polyimide film in a hot press method under the interposition of an adhesive layer.

The manufacturing method of the flexible cable jumper device may be performed by assembling the connector to the terminal part by the SMT method after completing the flexible cable structure. In order to connect the connector to the flexible cable jumper structure, the SMT method may be used, but the present disclosure is not limited thereto. Hereinafter, the method of manufacturing the flexible cable jumper structure will be described in detail.

Figure 5:
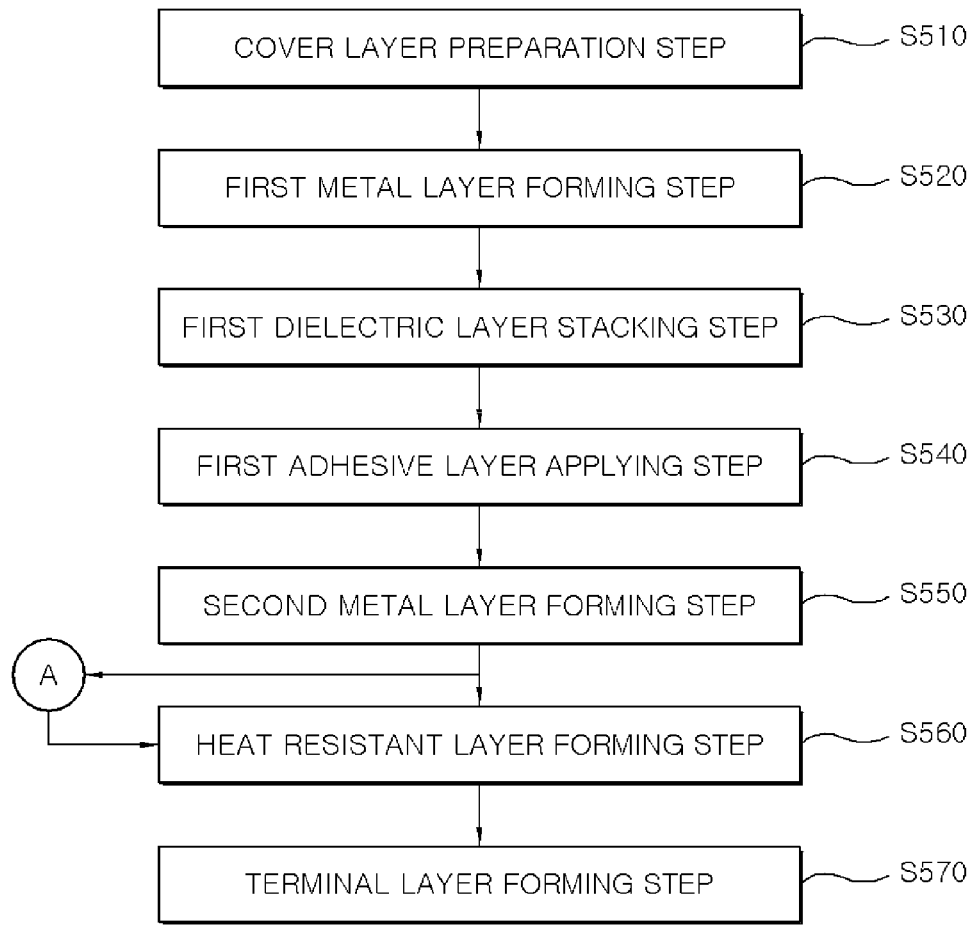
FIG. 5 is a manufacturing process flowchart for illustratively explaining a manufacturing method of a flexible cable jumper structure of the present disclosure.

FIG. 5 is a manufacturing process flowchart for illustratively explaining the manufacturing method of the flexible cable jumper structure of the present disclosure. Referring to FIG. 5, the step of preparing the cover layer may be performed (S510). The cover layer may be prepared by forming a polyimide film having a thickness of 25 µm to 40 µm on a base substrate. It is preferable to prepare the cover layer by a printing method rather than a spray method.

A metal may be stacked on the cover layer to a thickness of 1 µm to 10 µm, and a first metal layer may be formed by etching the metal to form a predetermined circuit pattern (S520).

A first dielectric layer is stacked on the first metal layer, and the stacking thickness may be 100 µm to 150 µm, and preferably 110 µm to 140 µm (S530). Polytetrafluoroethylene may be used for the first dielectric layer, and the polytetrafluoroethylene produced by casting or cutting may be used. The first dielectric layer may be used by forming roughness on the surface of the first dielectric layer through a chemical etching process on the upper and/or lower surface in order to increase adhesion. This may be etched before stacking the first dielectric layer, or may be etched after stacking the first dielectric layer. If etching is performed after stacking the dielectric layer, there is an advantage in that the process is simplified.

An adhesive may be applied on the first dielectric to apply a first adhesive layer (S540). Here, the thickness of the adhesive may be 30 µm to 70 µm, preferably 40 µm to 60 µm.

A second metal layer may be formed by stacking a metal on the surface on which the first adhesive layer is applied, and etching the metal to form a predetermined circuit pattern (S550). In this case, as the second metal layer, a metal having excellent conductivity, such as copper, gold, silver, platinum, and the like having a thickness of 1 µm to 10 µm may be used.

Also, after forming the second metal layer, the step of forming the heat resistant layer may be performed (S560). According to another embodiment, step A may be performed after forming the second metal layer.

Figure 6:
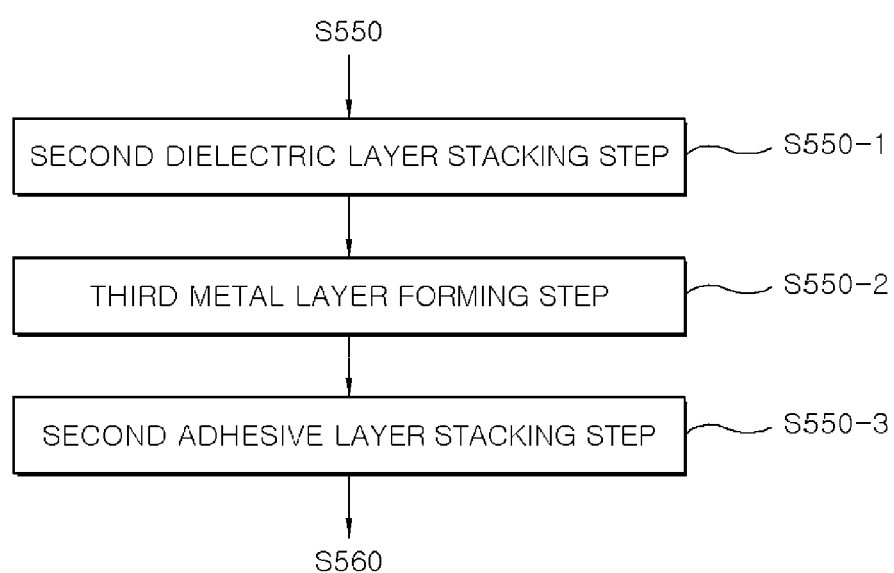
FIG. 6 is a manufacturing process flowchart for explaining in more detail a manufacturing method of a flexible cable jumper structure.

The process step A will be described with reference to a separate drawing. FIG. 6 is a manufacturing process flowchart for explaining in more detail a method of manufacturing a flexible cable jumper device according to another embodiment. Referring to FIG. 6, a step of stacking a second dielectric layer on the second metal layer may be performed (S550-1). The stacking thickness may be 100 µm to 150 µm, and preferably, 110 µm to 140 µm. For the second dielectric layer, polytetrafluoroethylene may be used, and the polytetrafluoroethylene produced by casting or cutting may be used. In addition, the step of forming irregularities on the upper surface or the lower surface of the second dielectric layer may be additionally performed. Etching may be performed before stacking the second dielectric layer, or after stacking the second dielectric layer. If etching is performed after stacking the dielectric layer, there is an advantage in that the process is simplified.

A third metal layer may be formed by stacking a metal on the second dielectric layer and etching the metal to form a predetermined circuit pattern (S550-2). In this case, as the third metal layer, a metal having excellent conductivity such as copper, gold, silver, platinum, and the like having a thickness of 1 µm to 10 µm may be used.

The second adhesive layer may be applied by applying an adhesive on the third metal layer (S550-3). Here, the thickness of the adhesive may be 30 µm to 70 µm, and preferably 40 µm to 60 µm. After the second adhesive layer is applied, the heat resistant layer forming step (S560) may be performed.

The step of forming a heat resistant layer on the third metal layer to which the second adhesive layer is applied may be performed (S560). In the embodiment in which step A is not performed, after forming the second metal layer, a process of applying an adhesive may be additionally performed before the step (S560) of forming the heat resistant layer. The heat resistant layer is for heat resistant characteristics, and a polyimide film having a thickness of 25 µm to 40 µm can be coated to form the heat resistant layer.

A metal may be stacked on the heat resistant layer, and the terminal layer 190 for electrically connecting to the connector may be formed (S570). In this case, the terminal layer 190 may be formed of a metal having a thickness of 1 µm to 10 µm and excellent in conductivity, such as copper, gold, silver, platinum, and the like.

The invention claimed is:

1. A flexible cable jumper structure comprising:
    a cover layer;
    a first metal layer stacked on the cover layer and having a circuit pattern formed thereon;
    a first dielectric layer stacked on the first metal layer;
    a first adhesive layer applied on the first dielectric layer;
    a second metal layer stacked on the first dielectric layer to which the first adhesive layer is applied and having a circuit pattern formed thereon;
    a heat resistant layer stacked on the second metal layer;
    a terminal layer formed in one region of the heat resistant layer and electrically connected to the first metal layer and the second metal layer;
    a second dielectric layer stacked on the second metal layer;
    a third metal layer stacked on the second dielectric layer and having a circuit pattern formed thereon; and
    a second adhesive layer applied on the third metal layer;
    wherein the heat resistant layer is formed on the third metal layer to which the second adhesive layer is applied.

2. The flexible cable jumper structure according to claim 1, wherein the cover layer and the heat resistant layer are polyimide.

3. The flexible cable jumper structure according to claim 1, wherein the first dielectric layer and the second dielectric layer are polytetrafluoroethylene.

4. The flexible cable jumper structure according to claim 1, wherein an upper surface or a lower surface of the second dielectric layer is provided with an irregularity.

5. A method for manufacturing a flexible cable jumper structure, comprising the steps of:
    preparing a cover layer;
    stacking a metal on the cover layer and etching the stacked metal to form a first metal layer forming a circuit pattern;
    stacking a first dielectric layer on the first metal layer;
    applying a first adhesive layer on the first dielectric layer;
    stacking a metal on the first dielectric layer to which the first adhesive layer is applied, and etching the stacked metal to form a second metal layer forming a circuit pattern;
    stacking a heat resistant layer on the second metal layer;
    forming a terminal layer formed in one region of the heat resistant layer and electrically connected to the first metal layer and the second metal layer;
    after forming the second metal layer, stacking a second dielectric layer on the second metal layer;
    stacking a metal on the second dielectric layer and etching the metal to form a circuit pattern to form a third metal layer; and
    stacking a second adhesive layer on the third metal layer.

6. The method for manufacturing a flexible cable jumper structure according to claim 5, further comprising the step of forming an irregularity on an upper surface or a lower surface of the second dielectric before the step of stacking the second dielectric layer.

7. The method for manufacturing a flexible cable jumper structure according to claim 5, further comprising the steps of: etching a surface of the first dielectric layer after the step of stacking the first dielectric layer; and etching a surface of the second dielectric layer after the step of stacking the second dielectric layer.

8. The method for manufacturing a flexible cable jumper structure according to claim 5, wherein in the step of stacking the heat resistant layer, the heat resistant layer is stacked by coating a polyimide film in a printing method.

9. The method for manufacturing a flexible cable jumper structure according to claim 5, wherein in the step of stacking the heat resistant layer, the heat resistant layer is stacked on the second metal layer by heating and pressing a polyimide film in a hot press method under an interposition of an adhesive layer.

\* \* \* \* \*